(12) United States Patent
Sakai et al.

(10) Patent No.: US 12,298,869 B2
(45) Date of Patent: May 13, 2025

(54) MEMORY CELL ARRAY UNIT

(71) Applicant: SONY SEMICONDUCTOR SOLUTIONS CORPORATION, Kanagawa (JP)

(72) Inventors: Lui Sakai, Kanagawa (JP); Yasuo Kanda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 12 days.

(21) Appl. No.: 18/248,113

(22) PCT Filed: Oct. 7, 2021

(86) PCT No.: PCT/JP2021/037181
§ 371 (c)(1),
(2) Date: Apr. 6, 2023

(87) PCT Pub. No.: WO2022/085471
PCT Pub. Date: Apr. 28, 2022

(65) Prior Publication Data
US 2023/0385165 A1    Nov. 30, 2023

(30) Foreign Application Priority Data

Oct. 19, 2020   (JP) .................................. 2020-175667

(51) Int. Cl.
*G06F 11/16*   (2006.01)
*H10B 63/00*   (2023.01)

(52) U.S. Cl.
CPC ........... *G06F 11/167* (2013.01); *H10B 63/00* (2023.02); *G06F 2201/805* (2013.01)

(58) Field of Classification Search
CPC ............... G06F 11/167; G06F 11/1666; G06F 2201/805; G11C 29/00; H01L 27/105;
(Continued)

(56) References Cited

U.S. PATENT DOCUMENTS 4,831,624 A * 5/1989 McLaughlin .......... H04B 1/667
704/229
2016/0103729 A1* 4/2016 Palframan ........... G06F 11/1666
714/15

FOREIGN PATENT DOCUMENTS

JP    11-249969 A     9/1999
JP    2002-050191 A   2/2002
(Continued)

OTHER PUBLICATIONS

Monis-Tuse F, Data transfer method and data processing system (translated/non-translated JP-3851093-B2) , 2006, pp. 1-30 (Year: 2006).*

(Continued)

*Primary Examiner* — Matthew M Kim
*Assistant Examiner* — Matthew N Putaraksa
(74) *Attorney, Agent, or Firm* — CHIP LAW GROUP

(57) ABSTRACT

A memory cell array unit according to an embodiment of the present disclosure includes a memory cell array and a microcontroller. The memory cell array includes an n-bit allocation bit allocated from a memory controller in read/write control, and a redundant bit of one or a plurality of bits not being provided with a switching mechanism that switches as a substitution for a portion of the allocation bit. The microcontroller reads and writes n-bit data from and into the memory cell array using the allocation bit and the redundant bit on the basis of the read/write control from the memory controller.

6 Claims, 13 Drawing Sheets

(58) Field of Classification Search
CPC ........ H10B 99/00; H10B 63/00; H10N 70/00; H10N 99/00
See application file for complete search history.

(56) References Cited

FOREIGN PATENT DOCUMENTS

| | | | | |
|---|---|---|---|---|
| JP | 3851093 | B2 * | 11/2006 | .......... G06F 11/1666 |
| JP | 2008-186460 | A | 8/2008 | |
| JP | 2010-146654 | A | 7/2010 | |
| JP | 2010-282725 | A | 12/2010 | |
| JP | 2015-121944 | A | 7/2015 | |

OTHER PUBLICATIONS

International Search Report and Written Opinion of PCT Application No. PCT/JP2021/037181, issued on Dec. 28, 2021, 09 pages of ISRWO.

* cited by examiner

[ FIG. 1 ]
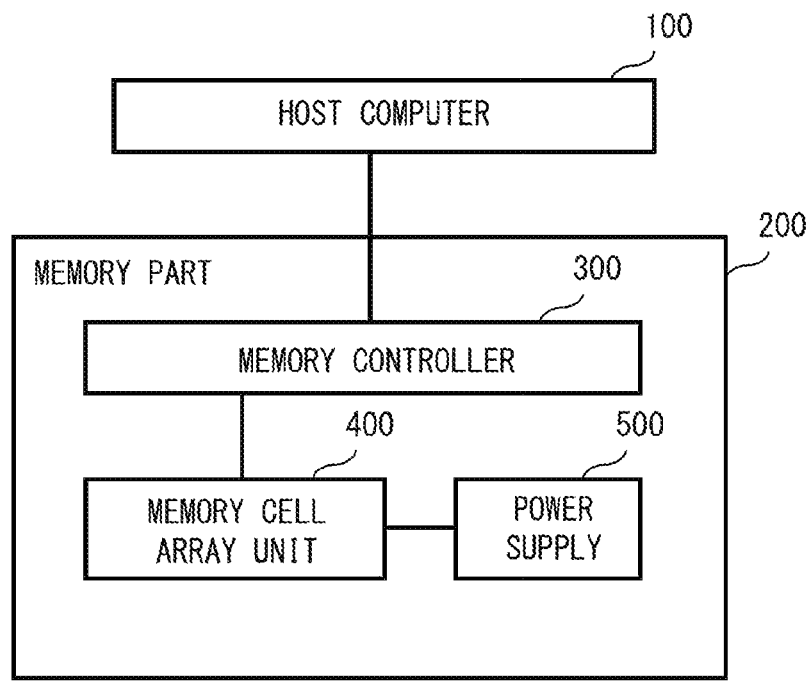
[ FIG. 2 ]
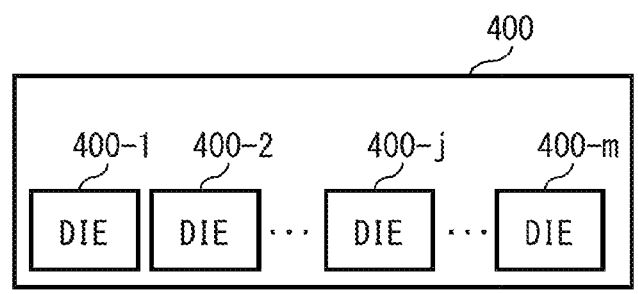

[FIG. 3]
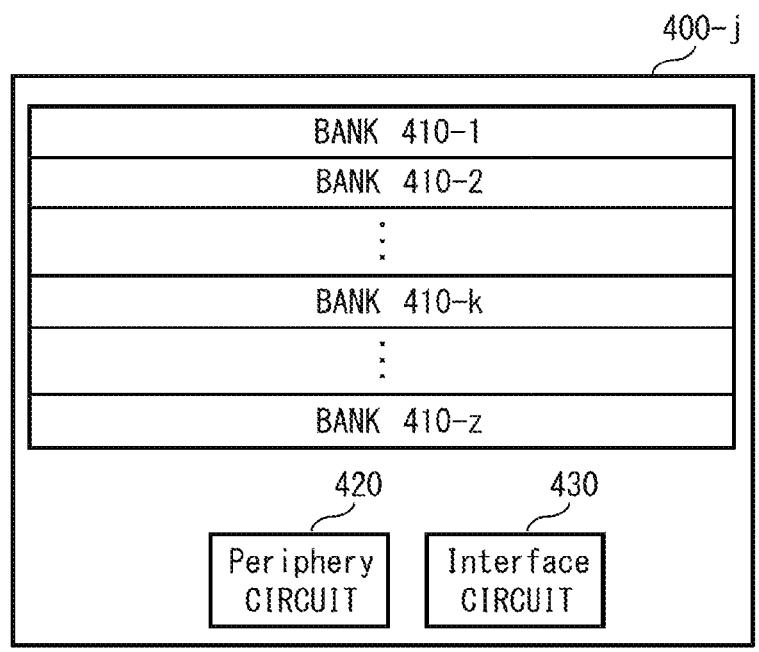

[FIG. 4]
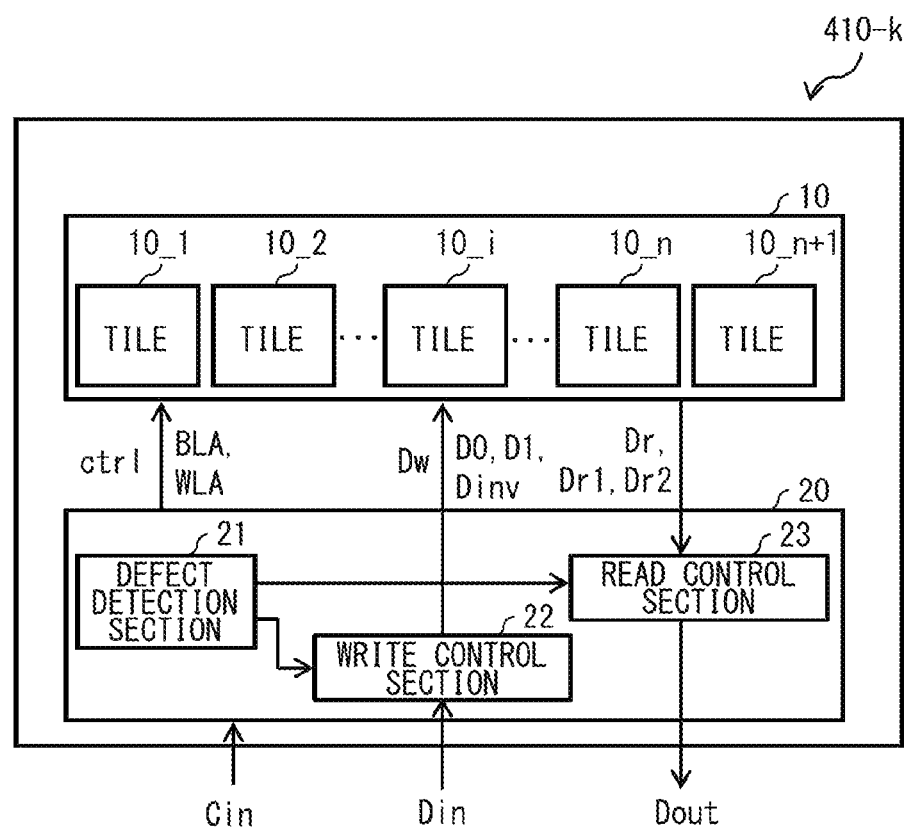

[ FIG.5 ]
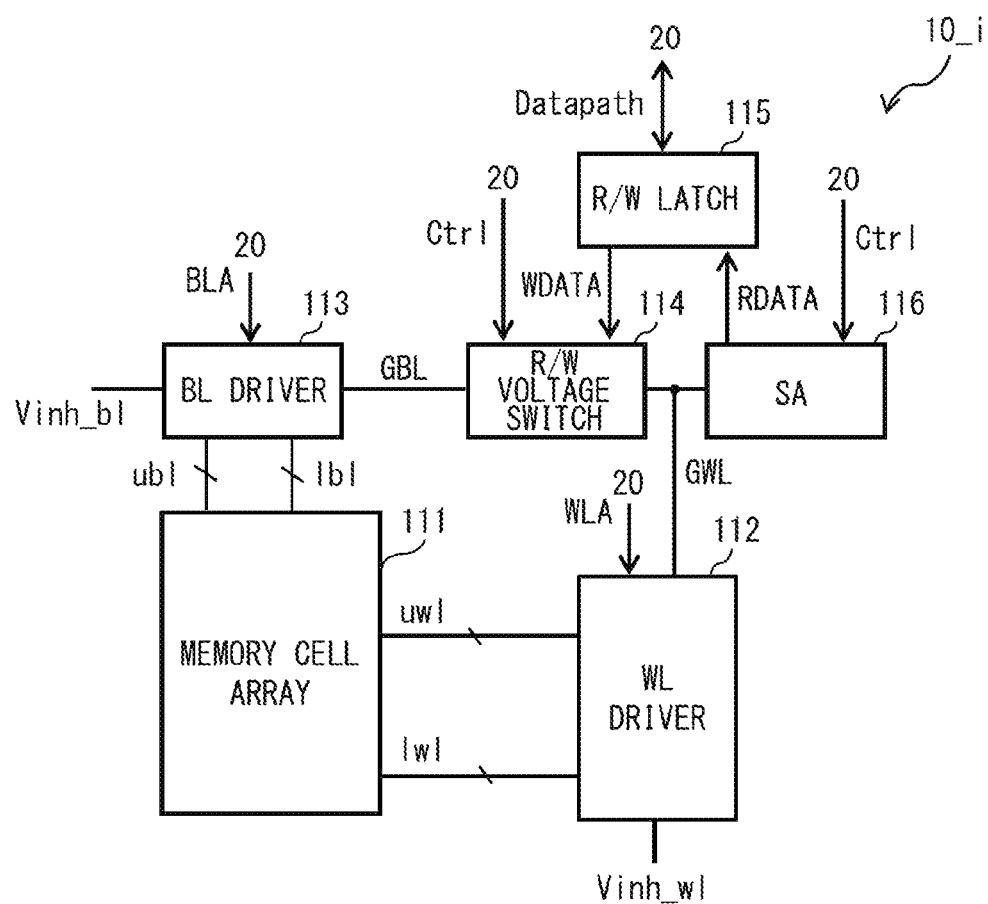

[ FIG. 6 ]
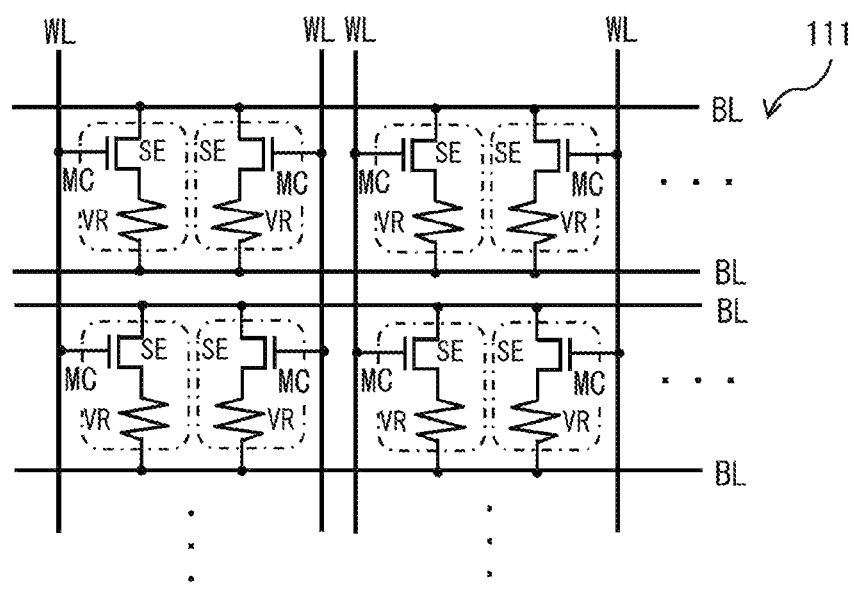

[FIG. 7]
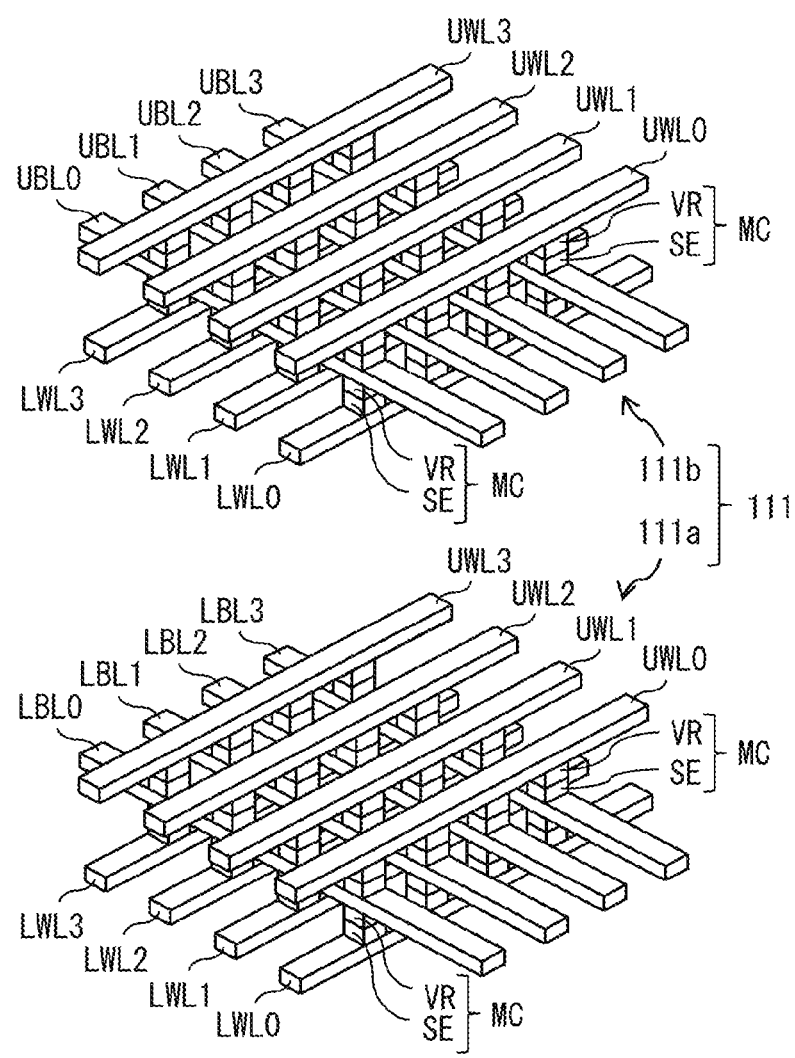

[FIG. 8]
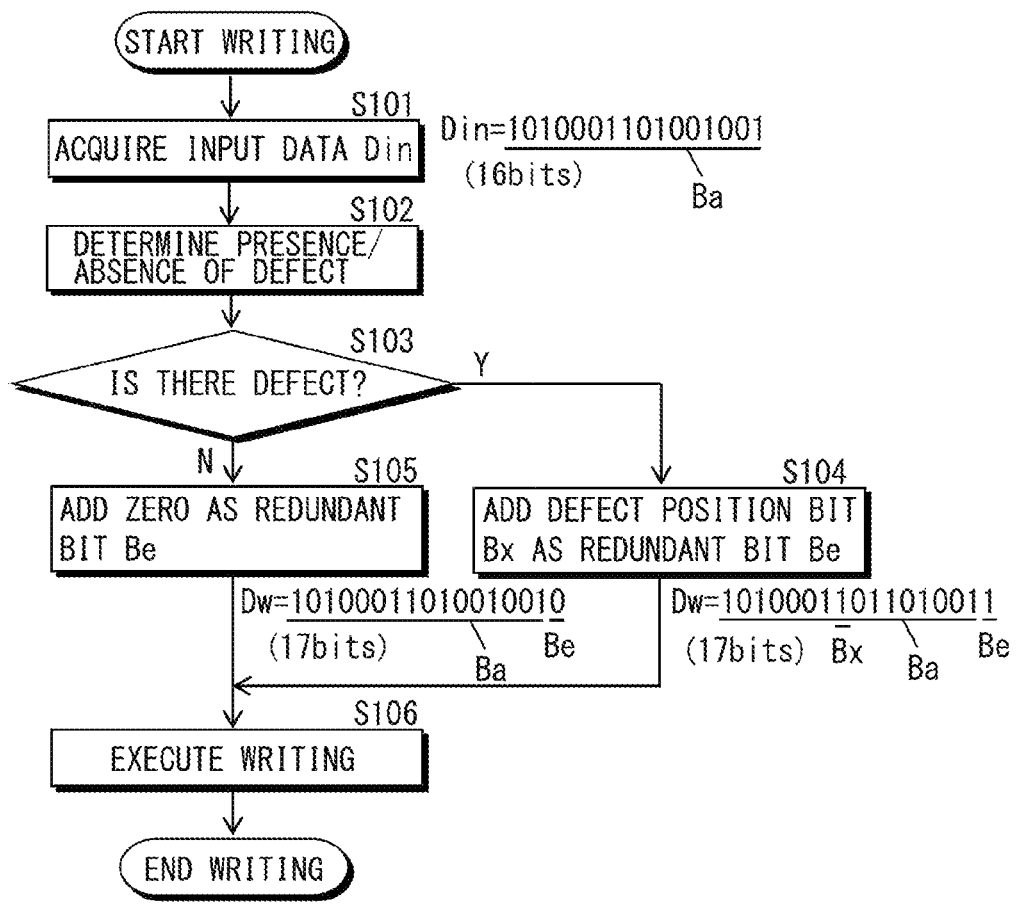

[ FIG. 9 ]
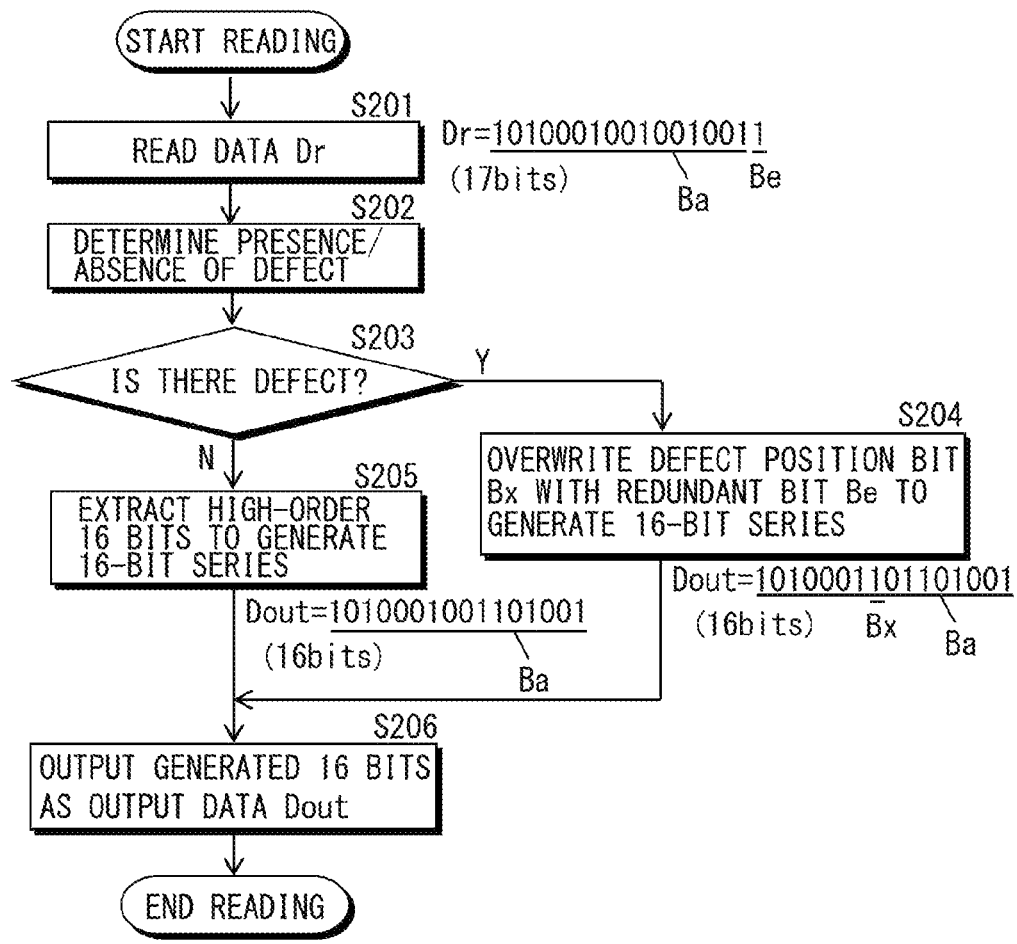

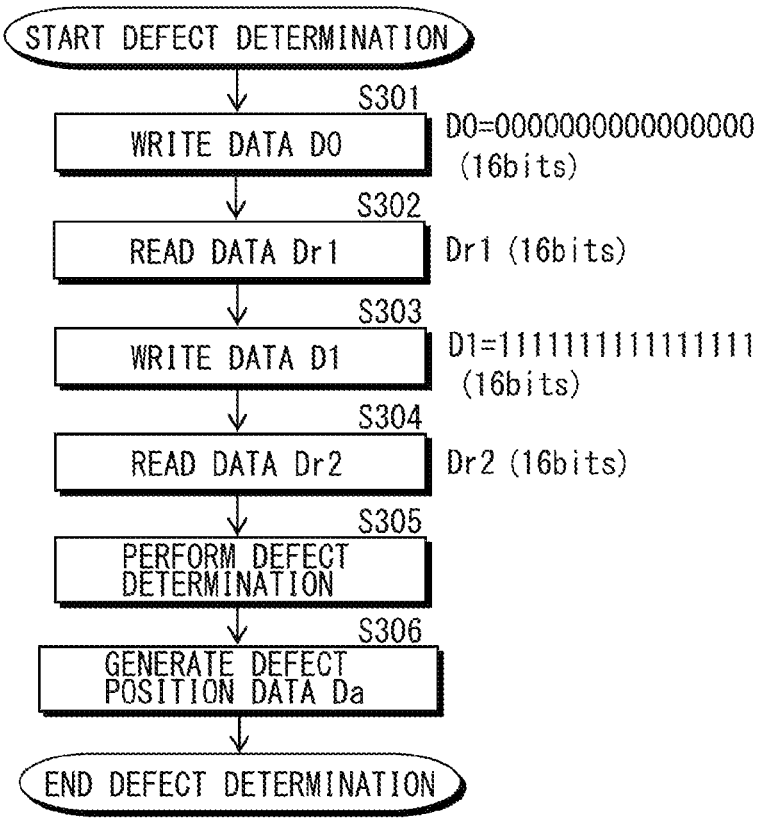

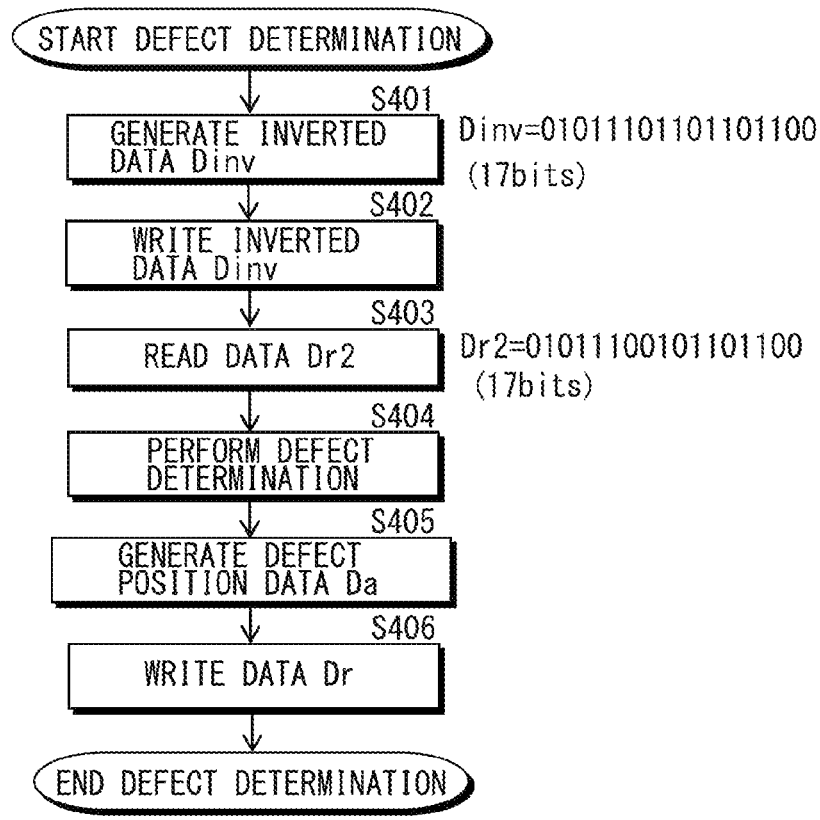

[ FIG. 12 ]
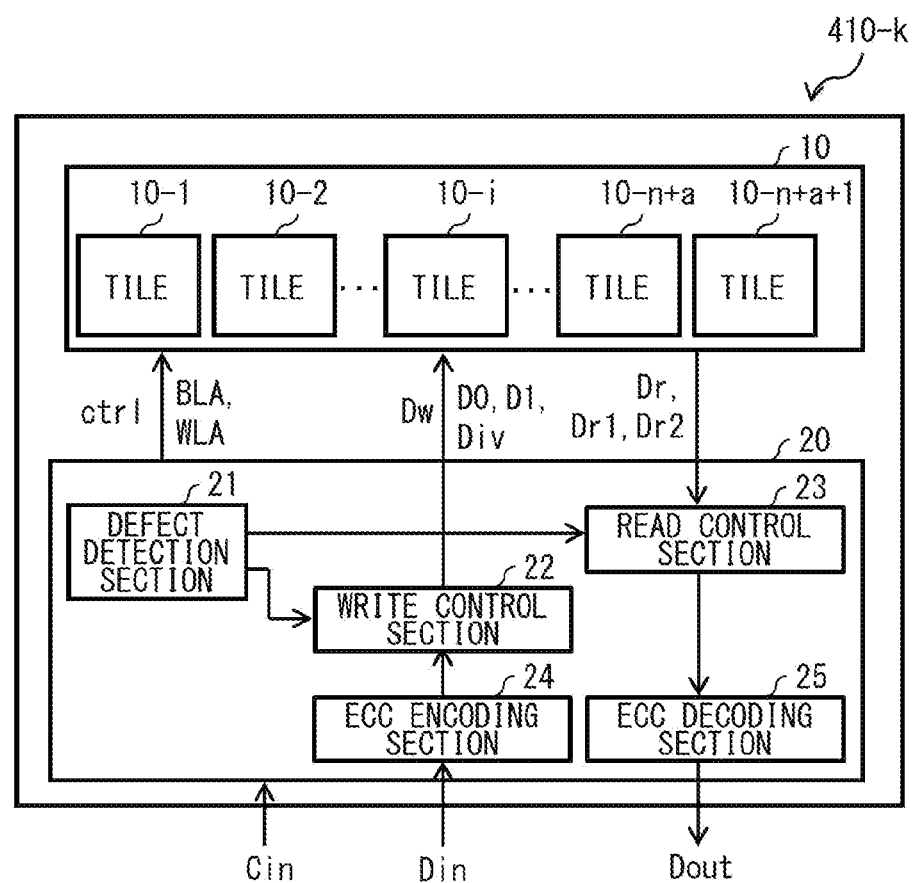

[ FIG. 13 ]
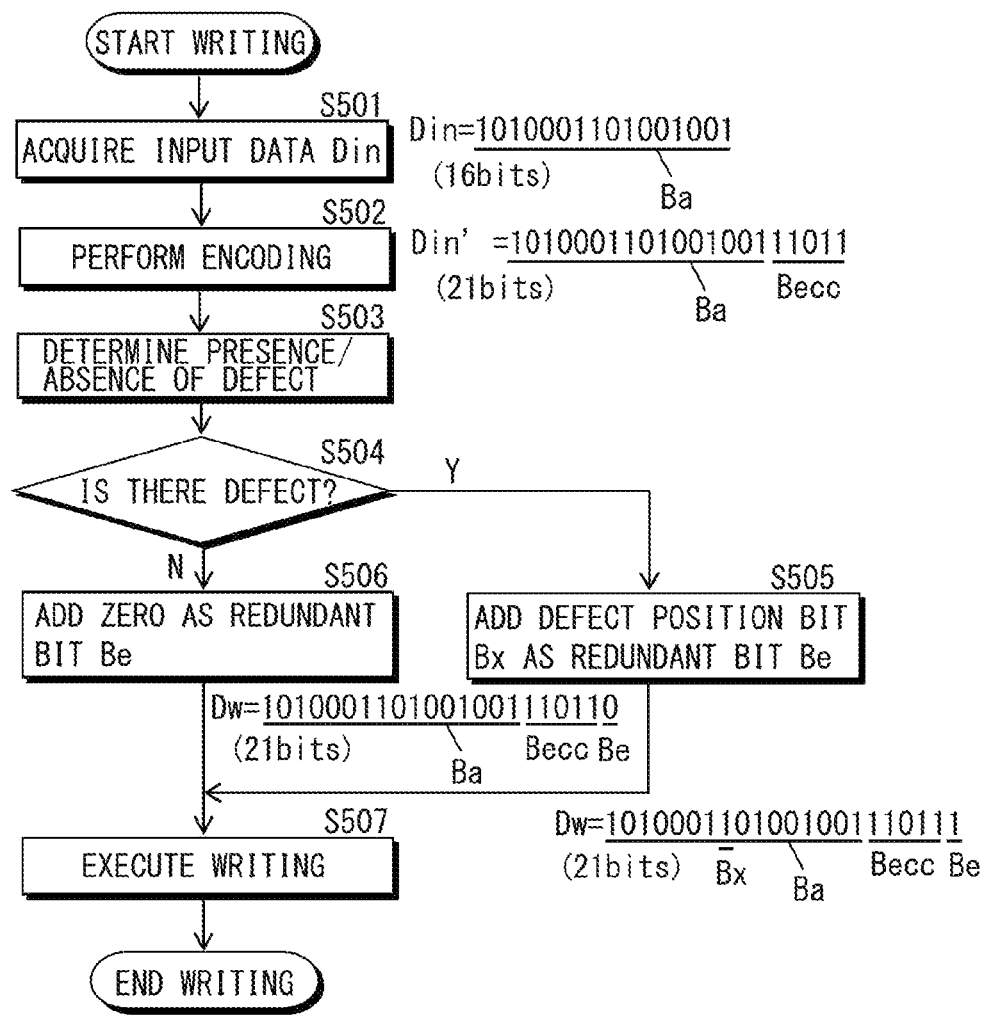

[ FIG. 14 ]
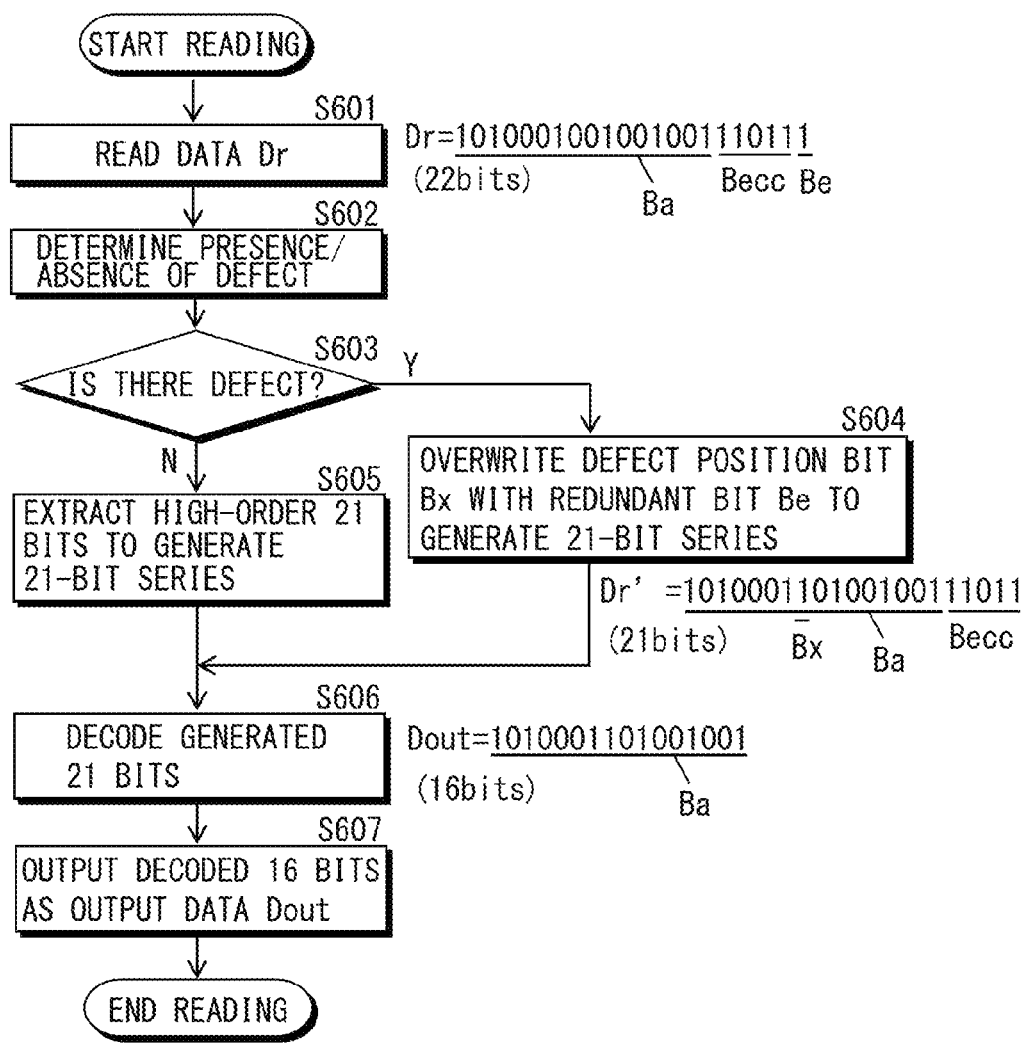

MEMORY CELL ARRAY UNIT

CROSS REFERENCE TO RELATED APPLICATIONS

This application is a U.S. National Phase of International Patent Application No. PCT/JP2021/037181 filed on Oct. 7, 2021, which claims priority benefit of Japanese Patent Application No. JP 2020-175667 filed in the Japan Patent Office on Oct. 19, 2020. Each of the above-referenced applications is hereby incorporated herein by reference in its entirety.

TECHNICAL FIELD

The present disclosure relates to a memory cell array unit.

BACKGROUND ART

A memory cell array unit including a rewritable non-volatile memory element has heretofore been known. In recent years, focus has been placed on a resistive RAM (ReRAM (Resistive RAM) as a rewritable memory cell array unit provided with a storage capacity exceeding that of a DRAM while having non-volatility. In such a memory cell array unit, in a case where a certain non-volatile memory element is disconnected or short-circuited, data read from such a non-volatile memory element would always have the same value. It has been proposed to substitute a defective non-volatile memory element with a substitution non-volatile memory element by using a fuse or a defect position table for such a defect (see, e.g., PTLs 1 to 3).

CITATION LIST

Patent Literature

PTL 1: Japanese Unexamined Patent Application Publication No. 2002-50191
PTL 2: Japanese Unexamined Patent Application Publication No. 2008-186460
PTL 3: Japanese Unexamined Patent Application Publication No. H11-249969

SUMMARY OF THE INVENTION

In a case of using a fuse, however, it is difficult to deal with a later defect. In addition, in a case of using a defect position table, it is difficult to have substitution information on a word-by-word basis due to limitations on the scale of a memory module. It is therefore desirable to provide a memory cell array unit that makes it possible to deal with a defect in a memory without using a fuse or a defect position table.

A memory cell array unit according to an embodiment of the present disclosure is a memory cell unit that is subjected to read/write control of n-bit data by a memory controller. The memory cell array unit includes a memory cell array and a microcontroller. The memory cell array includes n-bit allocation memory cells to which an n-bit allocation bit is allocated from the memory controller in the read/write control, and redundant memory cells of one or a plurality of bits. The memory cell array is not provided with a switching mechanism that switches to the redundant memory cells of the one or the plurality of bits, as a substitution for a portion of the n-bit allocation memory cells. The microcontroller reads and writes the n-bit data from and into the memory cell array using the n-bit allocation memory cells and the redundant memory cells of the one or the plurality of bits, on the basis of the read/write control from the memory controller.

The memory cell array unit according to an embodiment of the present disclosure is provided with the memory cell array including the redundant memory cells of the one or the plurality of bits. The memory cell array is not provided with the switching mechanism that switches to the redundant memory cells of the one or the plurality of bits, as a substitution for a portion of the n-bit allocation memory cells. Further, in the memory cell array unit according to an embodiment of the present disclosure, the n-bit data is read and written, in the microcontroller, from and into the memory cell array using the n-bit allocation memory cells and the redundant memory cells of the one or the plurality of bits, on the basis of the read/write control from the memory controller. This makes it possible to deal with a defect in the memory without using a fuse or a defect position table.

BRIEF DESCRIPTION OF THE DRAWINGS

FIG. 1 is a diagram illustrating an example of a schematic configuration of an information processing system according to an embodiment.
FIG. 2 is a diagram illustrating an example of a schematic configuration of a memory cell array unit in FIG. 1.
FIG. 3 is a diagram illustrating an example of a schematic configuration of each die in FIG. 2.
FIG. 4 is a diagram illustrating an example of a schematic configuration of each bank in FIG. 3.
FIG. 5 is a diagram illustrating an example of a schematic configuration of each tile in FIG. 4.
FIG. 6 is a diagram illustrating an example of a schematic configuration of a memory cell array in FIG. 5.
FIG. 7 is a diagram illustrating an example of a schematic configuration of the memory cell array in FIG. 5.
FIG. 8 is a diagram illustrating an example of a writing operation in the bank in FIG. 4.
FIG. 9 is a diagram illustrating an example of a reading operation in the bank in FIG. 4.
FIG. 10 is a diagram illustrating an example of a procedure to determine presence or absence of a defect in FIGS. 8 and 9.
FIG. 11 is a diagram illustrating a modification example of the procedure to determine presence or absence of a defect in FIGS. 8 and 9.
FIG. 12 is a diagram illustrating a modification example of a schematic configuration of the bank in FIG. 4.
FIG. 13 is a diagram illustrating an example of a writing operation in the bank in FIG. 12.
FIG. 14 is a diagram illustrating an example of a reading operation in the bank in FIG. 12.

MODES FOR CARRYING OUT THE INVENTION

Hereinafter, detailed description is given of modes for carrying out the present disclosure with reference to the drawings. However, embodiments described below are merely exemplary, and there is no intention of excluding application of various modifications and technologies not explicitly described below. The present technology can be implemented by making modifications in a wide variety of ways (e.g., combining embodiments, etc.) in a range not deviating from the gist of the present technology. In addition, in the following description of the drawings, the same or similar portions are denoted by the same or similar reference numerals. The drawings are schematic, and do not necessarily correspond to actual dimensions, proportions, or the like. The drawings may also include portions in which dimensional relationships or proportions differ from each other.

1. Embodiment

[Configuration]

FIG. 1 illustrates an example of functional blocks of an information processing system according to an embodiment. The information processing system includes a host computer 100 and a memory part 200. The memory part 200 includes a memory controller 300, one or a plurality of memory cell array units 400, and a power supply 500. FIG. 1 exemplifies a state where one memory cell array unit 400 is provided. The memory part 200 corresponds to a specific example of a "memory module" of the present disclosure.

(Host Computer 100)

The host computer 100 controls the memory part 200. Specifically, the host computer 100 issues a command designating a logical address to be accessed, and supplies the command or data to the memory part 200. The host computer 100 receives data outputted from the memory part 200. Here, the command is directed to controlling the memory part 200, and includes, for example, a write command ordering processing to write data, or a read command ordering processing to read data. In addition, the logical address is an address allocated for each access unit region when the host computer 100 accesses the memory part 200 in an address space defined by the host computer 100.

(Memory Controller 300)

The memory controller 300 controls the one or the plurality of memory cell array units 400. The memory controller 300 receives a write command designating a logical address from the host computer 100. In addition, the memory controller 300 executes the processing to write data in accordance with the write command. In this write processing, the logical address is converted into a physical address, and data is written into the physical address. Here, the physical address is an address allocated in the one or the plurality of memory cell array units 400 for each access unit at the time when the memory controller 300 accesses the one or the plurality of memory cell array units 400. When receiving a read command designating a logical address, the memory controller 300 converts the logical address into a physical address, and reads data from the physical address. Then, the memory controller 300 outputs, as read data, the read data to the host computer 100.

(Power Supply 500)

The power supply 500 supplies a desired voltage to the one or the plurality of memory cell array units 400. The power supply 500 supplies a WL driver 112 described later, for example, with a voltage or the like to be used upon writing or reading. The power supply 500 supplies a BL driver 113 described later, for example, with a voltage or the like to be used upon writing or reading.

(Memory Cell Array Unit 400)

Next, description is given of the memory cell array unit 400. FIG. 2 illustrates an example of functional blocks of the memory cell array unit 400. The memory cell array unit 400 is configured by, for example, semiconductor chips. As illustrated in FIG. 2, the memory cell array unit 400 includes, for example, m pieces of dies 400-$j$ (1≤$j$≤m). As illustrated in FIG. 3, each of the dies 400-$j$ includes, for example, z pieces of banks 410-$k$ (1≤$k$≤z), a Periphery circuit 420 that controls access to each of the banks 410-$k$, and an Interface circuit 430 that communicates with the memory controller 300.

As illustrated in FIG. 4, each of the banks 410-$k$ includes, for example, a memory cell array 10 and a microcontroller 20.

The memory cell array 10 includes n+1 (17 when n=16) tiles 10_$i$ (1≤$i$≤n+1) each having a 1-bit access unit. The microcontroller 20 controls access to each of the tiles 10_$i$, and communicates with the memory controller 300. In each of the banks 410-$k$, the microcontroller operates the plurality of tiles 10_$i$ in a coordinated manner to achieve access to a data block of a predetermined bit size as a whole.

In each of the banks 410-$k$, for example, the microcontroller 20 uses a 1-bit redundant bit Be, and an n-bit allocation bit Ba allocated to each of the banks 410-$k$ from the memory controller 300 for data writing and data reading, on the basis of read/write control from the memory controller 300, to read and write n-bit data from and into the memory cell array 10. It is to be noted that the memory cell array 10 includes n-bit (n pieces of) allocation memory cells (memory cells MC described later) to which the n-bit allocation bits Ba are allocated, and a 1-bit (one) redundant memory cell (memory cell MC described later) to which the 1-bit redundant bit Be is allocated. The memory cell array 10 is not provided with a switching mechanism (e.g., fuse circuit) that switches to a 1-bit redundant memory cell as a substitution for a portion of n-bit allocation memory cells.

In each of the banks 410-$k$, for example, the microcontroller 20 accesses an n+1-bit data block in which the 1-bit redundant bit Be is added to the n-bit allocation bit Ba, on the basis of the read/write control from the memory controller 300. At this time, the microcontroller 20 accesses the n-bit allocation memory cell and the 1-bit redundant memory cell, in the memory cell array 10. In each of the banks 410-$k$, the microcontroller 20 accesses the n-bit allocation memory cell and the 1-bit redundant memory cell or the n-bit allocation memory cell, for example, when performing "defect determination (described later)" which is preprocessing upon data writing or data reading.

Each of the tiles 10_$i$ includes, for example, a memory cell array 111 as illustrated in FIG. 5. For example, as illustrated in FIG. 6, the memory cell array 111 includes a 1-bit memory cell MC at each intersection of a word line WL and a bit line BL. The memory cell MC is a writable non-volatile memory. The memory cell MC has a series structure of a resistance change element VR (Variable Resistor) and a selection element SE (Selector Element). The resistance change element VR records 1-bit information depending on a state of high and low of a resistance value, and the selection element SE has bidirectional diode characteristics.

It is to be noted that the memory cell array 111 may be configured by memory cell arrays 111$a$ and 111$b$ in two layers, for example, as illustrated in FIG. 7. As illustrated in FIG. 7, each of the memory cell arrays 111$a$ and 111$b$ includes, for example, a 1-bit memory cell MC at each intersection point of an upper word line UWL and a bit line BL, and at each intersection of a lower word line LWL and the bit line BL. The memory cell MC is a writable non-volatile memory. The memory cell MC has a series structure of a resistance change element VR (Variable Resistor) and a selection element SE (Selector Element). The resistance change element VR records 1-bit information depending on a state of high and low of a resistance value, and the selection element SE has bidirectional diode characteristics.

Hereinafter, a word line WL is appropriately used as a generic term for the upper word line UWL and the lower word line LWL.

As illustrated in FIG. 5, each of the tiles 11 includes, for example, the WL driver 112, the BL driver 113, an R/W voltage switch 114, an R/W latch 115, and a sense amplifier (SA) 116.

On the basis of a control signal (a word line address WLA) by the microcontroller 20, the WL driver 112 applies a predetermined voltage to each word line WL. A voltage Vinh_w1 (e.g., 0 V) to be given to a non-selected word line WL is inputted to the WL driver 112. On the basis of a control signal (a bit line address BLA) by the microcontroller 20, the BL driver 113 selects a plurality of bit lines BL from among a plurality of bit lines BL. A voltage Vinh_b1 (e.g., 0 V) to be given to a non-selected bit line BL is inputted to the BL driver 113.

On the basis of a control signal Ctrl by the microcontroller 20 and write data WDATA by the R/W latch 115, the R/W voltage switch 114 switches voltages of nodes GWL and GBL to which selected word line WL and bit line BL are coupled. The write data WDATA corresponds to 1-bit data of write data (Dw, D0, D1, and Dinv) described later. The R/W latch 115 outputs the write data WDATA inputted from the microcontroller 20 to the R/W voltage switch 114. The R/W latch 115 further outputs read data RDATA inputted from the sense amplifier 116 to the microcontroller 20. The read data RDATA corresponds to 1-bit data of read data (Dr, Dr1, and Dr2) described later.

On the basis of the control signal Ctrl by the microcontroller 20, the sense amplifier 116 compares a voltage of the node GWL obtained from the WL driver 112 with Vref (e.g., about −1V) to determine whether the resistance change element VR is in a low-resistance state (LRS) or in a high-resistance state (HRS). The sense amplifier 116 generates logic zero in a case where the resistance change element VR is in the low-resistance state (LRS), and logic one is generated in a case where the resistance change element VR is in the high-resistance state (HRS), thereby generating the read data RDATA. The sense amplifier 116 outputs the generated read data RDATA to the R/W latch 115.

Suppose that, when the resistance change element VR is in the low-resistance state (LRS), a voltage across the memory cell MC is swept from 0 V. At this time, in a case where the voltage across the memory cell MC drops at 4 V, for example, to cause a current to abruptly flow into the memory cell MC, this phenomenon is called snap, and a snap voltage Vth LRS is 4 V. When the resistance change element VR is in the high-resistance state (HRS), the snap voltage Vth HRS becomes higher than the snap voltage Vth LRS, and reaches 6 V, for example. When 5 V, for example, is applied to the memory cell MC of which a state is desired to be known, the resistance change element VR is snapped when the resistance change element VR is in the low-resistance state (LRS), whereas the resistance change element VR is not snapped when the resistance change element VR is in the high-resistance state (HRS). Accordingly, discerning whether the snap is present or absent makes it possible to achieve the reading from the memory cell MC. When the resistance change element VR is in the high-resistance state (HRS), by snapping the resistance change element VR to flow a current of about 50 μA, for example, into the memory cell MC in a predetermined direction, the resistance change element VR changes into the low-resistance state (LRS). When the resistance change element VR is in the low-resistance state (LRS), by snapping the resistance change element VR to flow a current of about 30 μA, for example, into the memory cell MC in a predetermined direction, the resistance change element VR changes into the high-resistance state (HRS). Combination of the above-described reading and the change in resistance of the resistance change element VR makes it possible to achieve the writing into the memory cell MC.

In a case of reading the memory cell MC, for example, the tile 10_i charges a lower word line LWL0 to −2.5 V, and then brings it into a floating state. Further, for example, the tile 10_i applies +2.5 V to a bit line BL0. As a result, when the resistance change element VR of the memory cell MC at an intersection of the lower word line LWL0 and the bit line BL0 is in the low-resistance state (LRS), the resistance change element VR is snapped to discharge a parasitic capacitance of the lower word line LWL0, thus causing a potential of the lower word line LWL0 to rise to around V. When the resistance change element VR of the memory cell MC at the intersection of the lower word line LWL0 and the bit line BL0 is in the high-resistance state (HRS), the resistance change element VR is not snapped to cause only a slight leakage current to flow to the lower word line LWL0, and thus the potential of the lower word line LWL0 is kept around −2 V. At this time, for example, the tile 10_i compares the potential of the lower word line LWL0 with the Vref (e.g., about −1 V) by using the sense amplifier 116 to determine whether the resistance change element VR is in the low-resistance state (LRS) or in the high-resistance state (HRS). For example, the tile generates logic zero in a case where the resistance change element VR is in the low-resistance state (LRS), and generates logic one in a case where the resistance change element VR is in the high-resistance state (HRS), thereby generating the read data RDATA. For example, the tile 10_i outputs the generated read data RDATA to the microcontroller 20.

Incidentally, for each data unit in the memory cell array unit 400 accessed by the host computer 100, a data unit of each of the banks 410-k for writing and reading is very small, and is n bits (e.g., 16 bits). In order to meet a request (in particular, read request) of the host computer 100 with minimal delay, the memory controller 300 distributes access granularity of the host computer 100 to a plurality of banks 410-k for controlling reading and writing. Hereinafter, among write data inputted by the host computer 100 to the memory part 200, n-bit data distributed to each of the banks 410-k is referred to as "input data Din". In addition, among data read by the host computer 100 from the memory part 200 to, n-bit data read from each of the banks 410-k is referred to as "output data Dout".

In each of the banks 410-k, for the purpose of ensuring data reliability, and the like, the microcontroller 20 determines presence or absence of a defect in the n-bit allocation memory cell for each request of writing or reading from the memory controller 300 (host computer 100). Specifically, in each of the banks 410-k, the microcontroller 20 determines whether or not there is a defect in the memory cell MC (n-bit allocation bit Ba) to be a target (access target) of writing or reading, among tiles 10_i of the first bit to n-th bit, for each request of writing or reading from the memory controller 300 (host computer 100). Examples of this defect include a hardware defect in which the memory cell MC is disconnected or short-circuited, and a probability error. In the probability error, in a case where writing is repeatedly performed under the same condition, on very rare occasion, it is not possible to correctly perform writing into the memory cell MC. In addition, this defect includes not only an initial defect but also a later defect that occurs over time. This method of determining the defect is described in detail later.

When one defective memory cell MC is found during a writing operation, the microcontroller 20 adds, as the redundant bit Be, data of a bit corresponding to the defective memory cell MC (hereinafter, referred to as a "defect position bit Bx"), among acquired n-bit input data Din, to the end of the input data Din, thereby generating n+1-bit write data Dw. The microcontroller 20 writes the generated n+1-bit write data Dw into the memory cell array 10 (n-bit allocation memory cell, 1-bit redundant memory cell). That is, the microcontroller 20 writes the n-bit input data Din into the n-bit allocation memory cell, and writes, into the 1-bit redundant memory cell, data to be written into the defect position bit Bx.

When one defective memory cell MC is found during a reading operation, the microcontroller 20 acquires n+1-bit data Dr by reading one bit by one bit from each of the tiles 10_i. Thereafter, the microcontroller 20 extracts high-order n-bit data from the n+1-bit data Dr, and, in the extracted high-order n-bit data, replaces data read from the defect position bit Bx with data of the redundant bit Be, thereby generating n-bit read data (output data Dout). The microcontroller 20 outputs the generated n-bit output data Dout to the memory controller 300 (host computer 100).

When no defective memory cell MC is found during a writing operation, the microcontroller 20 adds, as the redundant bit Be, specific data (e.g., zero) to the end of the acquired n-bit input data Din, thereby generating the n+1-bit write data Dw. The microcontroller 20 writes the generated n+1-bit write data Dw into the memory cell array 10. That is, the microcontroller writes the n-bit input data Din into the n-bit allocation memory cell, and writes specific data (e.g., zero) into the 1-bit redundant memory cell.

When no defective memory cell MC is found during a reading operation, the microcontroller 20 acquires n+1-bit data Dr by reading one bit by one bit from each of the tiles 10_i. Thereafter, the microcontroller 20 extracts high-order n-bit data from the n+1-bit data Dr, thereby generating the n-bit read data (output data Dout). That is, the microcontroller 20 excludes the data of the redundant bit Be from the n+1-bit data Dr, thereby generating the n-bit read data (output data Dout). The microcontroller 20 outputs the generated n-bit output data Dout to the memory controller 300 (host computer 100).

In each of the banks 410-k, the microcontroller 20 includes, for example, a defect detection section 21, a write control section 22, and a read control section 23, as illustrated in FIG. 4.

FIG. 8 illustrates an example of a writing operation in each of the banks 410-k. FIG. 8 illustrates an example of the input data Din and the write data Dw at the time of n=16. The defect detection section 21 acquires the input data Din from the host computer 100 (step S101). Further, when control data Cin including a write command, a die ID, a bank address, a Row address, and a Column address is inputted from the host computer 100, the defect detection section 21 determines whether or not there is a defect in the memory cell MC to be a write target (access target) among tiles 10_i of the first bit to n-th bit to which the n-bit allocation bit Ba is allocated (step S102). As a result, in a case where one defective memory cell MC is found (step S103; Y), the defect detection section 21 adds, as the redundant bit Be, data of the defect position bit Bx, among n-bit input data in inputted from the host computer 100, to the end of the input data Din, thereby generating the n+1-bit write data Dw (step S104). Meanwhile, in a case where no defective memory cell MC is found (step S103; N), the defect detection section 21 adds specific data (e.g., zero) as the redundant bit Be to the end of the n-bit input data Din inputted from the host computer 100, thereby generating the n+1-bit write data Dw (step S105). The write control section 22 writes the write data Dw generated by the defect detection section 21 into the memory cell array 10 (step S106).

FIG. 9 illustrates an example of a reading operation in each of the banks 410-k. FIG. 9 illustrates an example of the data Dr and the output data Dout at the time of n=16. When the control data Cin including a read command, a die ID, a bank address, a Row address, and a Column address is inputted from the host computer 100, the defect detection section 21 reads data from the memory cell MC (n-bit allocation memory cell) to be a read target (access target), among tiles 10_i of the first bit to n-th bit, to thereby acquire the n+1-bit data Dr (step S201). At this time, the defect detection section 21 determines whether or not there is a defect in the memory cell MC (n-bit allocation memory cell) to be a read target (access target), among the tiles 10_i of the first bit to n-th bit (step S202). As a result, in a case where one defective memory cell MC is found (step S203; Y), the defect detection section 21 overwrites the data of the defect position bit Bx with the data of the redundant bit Be, among the read n+1-bit data Dr, thereby generating the n-bit read data (output data Dout) (step S204). Meanwhile, in a case where no defective memory cell MC is found (step S203; N), the defect detection section 21 extracts the high-order n-bit data from the read n+1-bit data Dr, thereby generating the n-bit read data (output data Dout) (step S205). The read control section 23 outputs the output data Dout generated by the defect detection section 21 to the memory controller 300 (host computer 100) (step S206).

Next, description is given of defect determination in each of the banks 410-k. FIG. 10 illustrates an example of a procedure to determine presence or absence of a defect in a writing operation or a reading operation. FIG. 10 illustrates an example of data D0, data Dr1, and data Dr2 at the time of n=16.

The defect detection section 21 first generates n-bit data D0 in which all the bits are zero, and outputs the generated n-bit data D0 to the write control section 22. When the data D0 is inputted from the defect detection section 21, the write control section 22 writes the inputted data D0 into the tiles 10_i of the first bit to n-th bit, among n+1 tiles 10_i included in the memory cell array 10 (step S301). Specifically, the write control section 22 writes the inputted data D0 into the memory cell MC (n-bit allocation memory cell) to be an access target, among the tiles 10_i of the first bit to n-th bit. Next, the defect detection section 21 requests the read control section 23 to read data from the memory cell MC (n-bit allocation memory cell) into which the writing has been performed in step S301. Then, the read control section 23 reads the data from the memory cell MC (n-bit allocation memory cell) into which the writing has been performed in step S301 to thereby acquire the data Dr1 (step S302). The read control section 23 outputs the acquired Dr1 to the defect detection section 21.

Next, the defect detection section 21 generates n-bit data D1 in which all the bits are one, and outputs the generated n-bit data D1 to the write control section 22. When the data D1 is inputted from the defect detection section 21, the write control section 22 writes the inputted data D1 into the memory cell MC (n-bit allocation memory cell) into which the writing has been performed in step S301 (step S303). Next, the defect detection section 21 requests the read control section 23 to read data from the memory cell MC (n-bit allocation memory cell) into which the writing has been performed in step S303. The read control section 23 reads the data from the memory cell MC (n-bit allocation memory cell) into which the writing has been performed in step S303 to thereby acquire the data Dr2 (step S304). The read control section 23 outputs the acquired Dr2 to the defect detection section 21.

The defect detection section 21 uses the data Dr1 and the data Dr2 inputted from the read control section 23 to perform defect determination of the memory cell MC (n-bit allocation memory cell) into which the writing has been performed in steps S301 and S303 (step S305). Specifically, the defect detection section 21 determines whether or not one is included in the data Dr1; in a case where one is included, the defect detection section 21 generates defect position data Da including information on a position (defect position bit Bx) corresponding to one in the data Dr1. The defect detection section 21 further determines whether or not zero is included in the data Dr2; in a case where zero is included, the defect detection section 21 generates the defect position data Da including information on a position (defect position bit Bx) corresponding to zero in the data Dr2. In a case where one is not included in the data Dr1 or in a case where zero is not included in the data Dr2, the defect detection section 21 generates the defect position data Da not including the information on the defect position bit Bx. In this manner, the defect detection section 21 performs defect detection. In a case where the obtained defect position data Da includes the information on the defect position bit Bx, the defect detection section 21 determines, in steps S102 and S202, that there is a defect.

The defect detection section 21 may perform defect determination, for example, in a procedure as illustrated in FIG. 11 in the reading operation. FIG. 11 illustrates a modification example of a procedure to determine presence or absence of a defect in the reading operation. FIG. 11 illustrates an example of the inverted data Dinv and the data Dr2 at the time of n=16.

The defect detection section 21 first generates data (inverted data Dinv) in which the read data Dr is inverted (step S401). The defect detection section 21 outputs the generated inverted data Dinv to the write control section 22. When the inverted data Dinv is inputted from the defect detection section 21, the write control section 22 writes the inputted inverted data Dinv into n+1 tiles 10_i included in the memory cell array 10 (step S402). Specifically, the write control section 22 writes the inputted inverted data Dinv into the memory cell MC (n-bit allocation memory cell, 1-bit redundant memory cell) from which the reading has been performed in step S201, among the tiles 10_i of the first bit to n-th bit. Next, the defect detection section 21 requests the read control section 23 to read data from the memory cell MC (n-bit allocation memory cell, 1-bit redundant memory cell) into which the writing has been performed in step S402. Then, the read control section 23 reads the data from the memory cell MC (n-bit allocation memory cell, 1-bit redundant memory cell) into which the writing has been performed in step S402 to thereby acquire n+1-bit data Dr2 (step S403). The read control section 23 outputs the acquired Dr2 to the defect detection section 21.

The defect detection section 21 compares the inverted data Dinv and the data Dr2, which are inputted from the read control section 23, with each other to perform defect determination of the memory cell MC (n-bit allocation memory cell, 1-bit redundant memory cell) from which the reading has been performed in steps S201 and S403 (step S404). Specifically, the defect detection section 21 compares the inverted data Dinv and the data Dr2 with each other one bit by one bit to determine whether or not they are consistent with each other. In a case where an inconsistent bit is found, the defect detection section 21 generates the defect position data Da including information on the positions of bits (defect position bits Bx) inconsistent with the inverted data Dinv, among the data Dr2. In a case where no inconsistent bit is found (in a case where all bits are consistent), the defect detection section 21 generates the defect position data Da not including the information on the defect position bit Bx. In this manner, the defect detection section 21 performs defect detection. Finally, the defect detection section 21 writes (writes back) the data Dr into the memory cell MC (n-bit allocation memory cell, 1-bit redundant memory cell) from which the reading has been performed in steps S201 and S403. In this manner, the defect detection section 21 performs defect detection. In a case where the obtained defect position data Da includes the information on the defect position bit Bx, the defect detection section 21 determines, in step S202, that there is a defect.

Effects

Next, description is given of effects of the memory cell array unit 400 according to an embodiment.

A memory module including a rewritable non-volatile memory element has heretofore been known. In recent years, focus has been placed on a resistive RAM (ReRAM (Resistive RAM) as a rewritable memory module provided with a storage capacity exceeding that of a DRAM while having non-volatility. For such a defect, it has been proposed to substitute a defective non-volatile memory element with a substitution non-volatile memory element by using a fuse or a defect position table. In a case of using a fuse, however, it is difficult to deal with a later defect. In addition, in a case of using a defect position table, it is difficult to have substitution information on a word-by-word basis due to limitations on the scale of a memory module.

Meanwhile, in the present embodiment, the tile 10_i (i=n+1) including the 1-bit redundant bit Be is provided instead of the fuse or the defect position table. The memory cell array 10 is not provided with the switching mechanism such as a fuse circuit. Further, in the present embodiment, the microcontroller 20 is provided that reads and writes n-bit data from and into the memory cell array 10 using the allocation bit Ba and the redundant bit Be on the basis of the read/write control from the memory controller 300. This makes it possible to deal with a defect in the memory without using a fuse or a defect position table. In particular, even when there is a later defect, a memory with the later defect is dynamically avoided to perform access, thus making it possible to lower the probability of occurrence of an error. In addition, unlike bit or word line substitution, defect positions that differ for respective words (e.g., for every 16 bits) are avoided, thus making it possible to improve the yield as well.

In addition, in the present embodiment, a determination is made as to the presence or absence of a defect in the n-bit allocation memory cell every time n-bit data is read and written from and into the memory cell array 10. This makes it possible to deal with a defect in the memory without using a fuse or a defect position table.

In addition, in the present embodiment, when a defect is found in a portion of the n-bit allocation memory cell, n-bit data is written into the n-bit allocation memory cell, and the data to be written into the defect position bit Bx is written into the 1-bit redundant memory cell. This makes it possible to deal with a defect in the memory by using the 1-bit redundant memory cell without using a fuse or a defect position table.

In addition, in the present embodiment, when no defect is found in a portion of the n-bit allocation memory cell, n-bit data is written into the n-bit allocation memory cell, and specific data (e.g., zero) is written into the 1-bit redundant memory cell. In this manner, in a case where there is no defect in the memory, writing the n-bit data into the n-bit allocation memory cell makes it possible to perform correct data writing.

In addition, in the present embodiment, when a defect is found in a portion of the n-bit allocation memory cell, in the data read from the n-bit allocation memory cell, replacing the data read from the defect position bit Bx with the data read from the 1-bit redundant memory cell allows for generation of the n-bit read data (output data Dout). This makes it possible to deal with a defect in the memory by using the 1-bit redundant memory cell without using a fuse or a defect position table.

In addition, in the present embodiment, when no defect is found in a portion of the n-bit allocation memory cell, the data read from the n-bit allocation memory cell serves as the n-bit read data (output data Dout).

2. Modification Examples

Next, description is given of modification examples of the information processing system according to the foregoing embodiment.

Modification Example A

FIG. 12 illustrates a modification example of the bank 410-*k* according to the foregoing embodiment. In the bank 410-*k* according to the present modification example, the microcontroller 20 further includes, for example, an ECC (Error Correction Code) encoding section 24 and an ECC decoding section 25, in addition to the defect detection section 21, the write control section 22, and the read control section 23, as illustrated in FIG. 12.

The ECC encoding section 24 encodes the n-bit input data Din inputted from the memory controller 300, for example. The ECC encoding section 24 generates a-bit (e.g., 5-bit) ECC parity data, for example, on the basis of the n-bit input data Din. For example, the ECC encoding section 24 further adds the generated a-bit ECC parity data to the n-bit input data Din, thereby generating n+a-bit input data Din'. The ECC encoding section 24 outputs the generated n+a-bit input data Din' to the write control section 22.

There are two objectives of the ECC parity. The first is to correct a bit error that occurs randomly in a transmission path during writing into the memory cell array 10. The second is to allow occurrence of a bit defect up to a predetermined number of bits when the bit defect occurs accidentally or due to wear during writing into the memory cell array 10, and to ensure data reliability by decoding (error correction) during reading.

For example, the ECC decoding section 25 decodes n-bit data of a portion, excluding the a-bit ECC parity data, in n+a-bit data Dr' generated by the read control section 23, by using the a-bit ECC parity data. For example, the ECC decoding section 25 outputs n-bit data obtained by the decoding as the output data Dout.

In each of the banks 410-*k* according to the present modification example, the memory cell array 10 may include, for example, n+a+1 tiles 10_*i*, as illustrated in FIG. 12. In each of the banks 410-*k* according to the present modification example, on the basis of the read/write control from the memory controller 300, for example, the microcontroller 20 reads and writes n-bit data from and into the memory cell array 10 using the n-bit allocation bit Ba, which is allocated for data writing and data reading to each of the banks 410-*k* from the memory controller 300, an a-bit ECC parity bit Becc, and the 1-bit redundant bit Be. It is to be noted that the memory cell array 10 includes n-bit (n pieces of) allocation memory cells, a-bit (a pieces of) ECC parity memory cells, and 1-bit (one) redundant memory cell. It is to be noted that the memory cell array 10 is not provided with the switching mechanism (e.g., fuse circuit) to switch to the 1-bit redundant memory cell as a substitution for a portion of the a-bit ECC parity memory cell and the n-bit allocation memory cell.

In each of the banks 410-*k*, on the basis of the read/write control from the memory controller 300, for example, the microcontroller 20 accesses an n+a+1-bit data block in which the a-bit ECC parity bit Becc and the 1-bit redundant bit Be are added to the n-bit allocation bit Ba. At this time, in each of the banks 410-*k*, the microcontroller 20 accesses an n-bit memory cell, the a-bit ECC parity memory cell, and the 1-bit redundant memory cell in the memory cell array 10. In each of the banks 410-*k*, for example, when performing "defect determination", which is preprocessing upon data writing or data reading, the microcontroller 20 accesses the n-bit allocation memory cell, the a-bit ECC parity memory cell and the 1-bit redundant memory cell, or accesses the n-bit allocation memory cell and the a-bit ECC parity memory cell.

In each of the banks 410-*k*, for the purpose of ensuring data reliability, and the like, the microcontroller 20 determines presence or absence of a defect in the n-bit allocation memory cell and the a-bit ECC parity memory cell for each request of writing or reading from the memory controller 300 (host computer 100). Specifically, in each of the banks 410-*k*, the microcontroller determines whether or not there is a defect in the memory cell MC (n-bit allocation memory cell, a-bit ECC parity memory cell) to be a target (access target) of writing or reading, among tiles 10_*i* of the first bit to n+a-th bit, for each request of writing or reading from the memory controller 300 (host computer 100).

When one defective memory cell MC is found during a writing operation, the microcontroller 20 adds, as redundant bit data, data of the defect position bit Bx, among the n-bit input data Din and the a-bit ECC parity bit data, to the end of the input data Din, thereby generating n+a+1-bit write data Dw. The microcontroller 20 writes the generated n+a+1-bit write data Dw into the memory cell array 10 (n-bit allocation memory cell, a-bit ECC parity memory cell, 1-bit redundant memory cell). That is, the microcontroller 20 writes the n-bit input data Din into the n-bit allocation memory cell. The microcontroller 20 writes the a-bit ECC parity data into the a-bit ECC parity memory cell. The microcontroller 20 writes data to be written into the defect position bit Bx into the 1-bit redundant memory cell.

When one defective memory cell MC is found during a reading operation, the microcontroller 20 acquires n+a+1-bit data Dr by reading one bit by one bit from each of the tiles 10_*i*. Thereafter, the microcontroller 20 extracts high-order n+a-bit data from the n+a+1-bit data Dr, replaces, in the extracted high-order n+a-bit data, data read from the defect position bit Bx with data of the redundant bit Be, and performs decoding, thereby generating the n-bit read data (output data Dout). The microcontroller 20 outputs the generated n-bit output data Dout to the memory controller 300 (host computer 100).

When no defective memory cell MC is found during a writing operation, the microcontroller 20 adds, as the redundant bit data, specific data (e.g., zero) to the end of the a-bit ECC parity data and the n-bit input data Din, thereby generating the n+a+1-bit write data Dw. The microcontroller 20 writes the generated n+a+1-bit write data Dw into the memory cell array 10. That is, the microcontroller 20 writes the n-bit input data Din into the n-bit allocation memory cell. The microcontroller 20 writes the a-bit ECC parity data into the a-bit ECC parity memory cell. The microcontroller 20 writes specific data (e.g., zero) into the 1-bit redundant memory cell.

When no defective memory cell MC is found during a reading operation, the microcontroller 20 acquires n+a+1-bit data Dr by reading one bit by one bit from each of the tiles 10_i. Thereafter, the microcontroller 20 extracts high-order n+a-bit data from the n+a+1-bit data Dr, replaces, in the extracted high-order n+a-bit data, data read from the defect position bit Bx with data of the redundant bit Be, and performs decoding, thereby generating the n-bit read data (output data Dout). The microcontroller 20 outputs the generated n-bit output data Dout to the memory controller 300 (host computer 100).

FIG. 13 illustrates an example of a writing operation in each of the banks 410-k. FIG. 13 illustrates an example of the input data Din and the write data Dw at the time of n=16 and a=5. The ECC encoding section 24 acquires the input data Din from the host computer 100 (step S501). Next, the ECC encoding section 24 encodes the acquired input data Din (step S502). The ECC encoding section 24 generates the a-bit (e.g., 5-bit) ECC parity data, for example, on the basis of the n-bit input data Din. The ECC encoding section 24 further adds the generated a-bit ECC parity data to the n-bit input data Din, for example, thereby generating the n+a-bit input data Din'. The ECC encoding section 24 outputs the generated n+a-bit input data Din' to the write control section 22.

Further, when the control data Cin including a write command, a die ID, a bank address, a Row address, and a Column address is inputted from the host computer 100, the defect detection section 21 determines whether or not there is a defect in the memory cell MC to be a write target (access target) among tiles 10_i of the first bit to n+a-th bit to which the n-bit allocation bit Ba and the a-bit ECC parity bit Becc are allocated (step S503). As a result, in a case where one defective memory cell MC is found (step S504; Y), the defect detection section 21 adds, as the redundant bit data, data of the defect position bit Bx, among n-bit input data in and the a-bit ECC parity data, to the end of the a-bit ECC parity data and the n-bit input data in, thereby generating the n+a+1-bit write data Dw (step S505). Meanwhile, in a case where no defective memory cell MC is found (step S504; N), the defect detection section 21 adds specific data (e.g., zero) as the redundant bit data to the end of the a-bit ECC parity data and the n-bit input data in, thereby generating the n+a+1-bit write data Dw (step S506). The write control section 22 writes the write data Dw generated by the defect detection section 21 into the memory cell array 10 (step S507).

FIG. 14 illustrates an example of a reading operation in each of the banks 410-k. FIG. 14 illustrates an example of the data Dr and the output data Dout at the time of n=16 and a=5. When the control data Cin including a read command, a die ID, a bank address, a Row address, and a Column address is inputted from the host computer 100, the defect detection section 21 reads data from the memory cell MC (n-bit allocation bit Ba) to be a read target (access target), among tiles 10_i of the first bit to n+a-th bit, to thereby acquire the n+a+1-bit data Dr (step S601). At this time, the defect detection section 21 determines whether or not there is a defect in the memory cell MC (n-bit allocation memory cell, a-bit ECC parity memory cell) to be a read target (access target), among the tiles 10_i of the first bit to n+a-th bit (step S602). As a result, in a case where one defective memory cell MC is found (step S603; Y), the defect detection section 21 overwrites the data of the defect position bit Bx with the data of the redundant bit Be, among the read n+a+1-bit data Dr, thereby generating n+a-bit read data Dr' (step S604). Meanwhile, in a case where no defective memory cell MC is found (step S603; N), the defect detection section 21 extracts the high-order n+a-bit data from the read n+a+1-bit data Dr, thereby generating the n+a-bit read data Dr' (step S605). The defect detection section 21 outputs the generated n+a-bit read data Dr' to the read control section 23. The read control section 23 outputs the n+a-bit read data Dr' inputted from the defect detection section 21 to the ECC decoding section 25. The ECC decoding section 25 decodes the n+a-bit read data Dr' inputted from the read control section 23, thereby generating the n-bit read data (output data Dout) (step S606). The ECC decoding section 25 outputs the generated output data Dout to the memory controller 300 (host computer 100) (step S607).

In the present modification example, the memory cell array 10 includes the n-bit allocation memory cell, the a-bit ECC parity memory cell, and a redundant memory cell of one or a plurality of bits. Further, the a-bit ECC parity data generated on the basis of data to be written into the n-bit allocation memory cell is written into the a-bit ECC parity memory cell. Accordingly, even in a case where two or more defects exist in the n-bit allocation memory cell, the use of the ECC parity data makes it possible to deal with a defect in the memory without using a fuse or a defect position table.

Modification Example B

In the foregoing embodiment and modification example thereof, the redundant bit Be is one bit; however, the redundant bit Be may be a plurality of bits. In this situation, even in a case where two or more defects exist in the n-bit allocation bit Ba, the use of the redundant bit Be makes it possible to deal with a defect in the memory without using a fuse or a defect position table.

Modification Example C

In the foregoing embodiment and modification examples thereof, a resistive RAM (ReRAM (Resistive RAM) is adopted as the memory cell MC; however, a resistive memory cell in a different form than the resistive RAM may be included. In addition, in the foregoing embodiment and modification examples thereof, the memory cell array 10 is provided inside the die 400-j or the bank 410-k; however, the memory cell array 10 may be provided inside a memory structure in a form different therefrom.

Although the description has been given of the present technology with reference to the embodiment and modification examples thereof, the present disclosure is not limited to the foregoing embodiment and the like, and may be modified in a wide variety of ways. It is to be noted that the effects described herein are merely exemplary. The effects of the present disclosure are not limited to those described herein. The present disclosure may also have effects other than those described herein.

In addition, for example, the present disclosure may have the following configurations.

(1)

A memory cell array unit subjected to read/write control of n-bit data by a memory controller, the memory cell array unit including:

a memory cell array including n-bit allocation memory cells to which an n-bit allocation bit is allocated from the memory controller in the read/write control and redundant memory cells of one or a plurality of bits, the memory cell array not being provided with a switching mechanism that switches to the redundant memory cells of the one or the plurality of bits, as a substitution for a portion of the n-bit allocation memory cells; and a microcontroller that reads and writes the n-bit data from and into the memory cell array using the n-bit allocation memory cells and the redundant memory cells of the one or the plurality of bits, on a basis of the read/write control from the memory controller.

(2)

The memory cell array unit according to (1), in which the microcontroller determines presence or absence of a defect in the n-bit allocation memory cells every time the microcontroller reads and writes the n-bit data from and into the memory cell array.

(3)

The memory cell array unit according to (2), in which, when a defect is found in a portion of the n-bit allocation memory cells, the microcontroller writes the n-bit data into the n-bit allocation memory cells, and writes, into the redundant memory cells of the one or the plurality of bits, data to be written into a bit of a defect position.

(4)

The memory cell array unit according to (2) or (3), in which, when no defect is found in a portion of the n-bit allocation memory cells, the microcontroller writes the n-bit data into the n-bit allocation memory cells, and writes specific data into the redundant memory cells of the one or the plurality of bits.

(5)

The memory cell array unit according to any one of (2) to (4), in which, when a defect is found in a portion of the n-bit allocation memory cells, the microcontroller generates n-bit read data by replacing, in data read from the n-bit allocation memory cells, data read from the bit of the defect position with data read from the redundant memory cells of the one or the plurality of bits.

(6)

The memory cell array unit according to any one of (2) to (5), in which, when no defect is found in a portion of the n-bit allocation memory cells, the microcontroller employs the data read from the n-bit allocation memory cells as the n-bit read data.

(7)

The memory cell array unit according to any one of (1) to (6), in which the memory cell array includes the n-bit allocation memory cells, a-bit ECC parity memory cells to which an a-bit ECC parity bit is allocated, and the redundant memory cells of the one or the plurality of bits, and the microcontroller writes, into the a-bit ECC parity memory cells, a-bit ECC parity data generated on a basis of data to be written into the n-bit allocation memory cells.

The memory cell array unit of an embodiment of the present disclosure is provided with a memory cell array including the redundant memory cells of the one or the plurality of bits, and not being provided with a switching mechanism that switches to the redundant memory cells of the one or the plurality of bits, as a substitution for a portion of the n-bit allocation memory cells. The n-bit data is read and written, in the microcontroller, from and into the memory cell array using the n-bit allocation memory cells and the redundant memory cells of the one or the plurality of bits, on the basis of the read/write control from the memory controller. This makes it possible to deal with a defect in the memory without using a fuse or a defect position table. It is to be noted that the effects of the present disclosure are not necessarily limited to the effects described herein, and may be any of the effects described herein.

This application claims the benefit of Japanese Priority Patent Application JP2020-175667 filed with the Japan Patent Office on Oct. 19, 2020, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A memory cell array unit, comprising:
a memory cell array including:
a plurality of n-bit allocation memory cells to which an n-bit allocation bit is allocated from a memory controller; and
a plurality of redundant memory cells; and
a microcontroller configured to:
determine a presence of a defective memory cell in the plurality of n-bit allocation memory cells;
write n-bit data into the plurality of n-bit allocation memory cells, based on the presence of the defective memory cell and a write control operation of the memory controller; and
write, based on the write control operation, first data of a bit corresponding to the defective memory cell into a redundant memory cell of the plurality of redundant memory cells,
wherein the n-bit data includes the first data.

2. The memory cell array unit according to claim 1, wherein the microcontroller is further configured to:
read the n-bit data from the plurality of n-bit allocation memory cells; and
determine the presence or an absence of the defective memory cell in the plurality of n-bit allocation memory cells every time the microcontroller one of reads the n-bit data or writes the n-bit data.

3. The memory cell array unit according to claim 2, wherein the microcontroller is further configured to:
write, based on the absence of the defective memory cell, the n-bit data into the plurality of n-bit allocation memory cells; and
write, based on the absence of the defective memory cell, second data into the redundant memory cell.

4. The memory cell array unit according to claim 2, wherein the microcontroller is further configured to:
read second data from the plurality of n-bit allocation memory cells based on a read control operation of the memory controller;
read the first data from the redundant memory cell based on the presence of the defective memory cell;

replace, in the second data read from the plurality of n-bit allocation memory cells, third data of the bit corresponding to the defective memory cell with the first data read from the redundant memory cell; and generate n-bit read data based on the replacement.

5. The memory cell array unit according to claim 2, wherein the microcontroller is further configured to:

read second data from the plurality of n-bit allocation memory cells based on a read control operation of the memory controller; and output the second data read from the plurality of n-bit allocation memory cells as n-bit read data based on the absence of the defective memory cell.

6. The memory cell array unit according to claim 1, wherein the memory cell array further includes a plurality of a-bit ECC parity memory cells to which an a-bit ECC parity bit is allocated, and the microcontroller is further configured to:

generate a-bit ECC parity data based on the n-bit data; and write the a-bit ECC parity data into the plurality of a-bit ECC parity memory cells.

* * * * *